(12) United States Patent
Huang et al.

(10) Patent No.: US 11,551,609 B2
(45) Date of Patent: *Jan. 10, 2023

(54) ARRAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Yue Long, Beijing (CN); Yao Huang, Beijing (CN); Chao Zeng, Beijing (CN); Meng Li, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/256,186

(22) PCT Filed: Oct. 14, 2019

(86) PCT No.: PCT/CN2019/111057
§ 371 (c)(1),
(2) Date: Dec. 25, 2020

(87) PCT Pub. No.: WO2021/072600
PCT Pub. Date: Apr. 22, 2021

(65) Prior Publication Data
US 2021/0375202 A1 Dec. 2, 2021

(51) Int. Cl.
*G09G 3/36* (2006.01)
*G09G 3/3225* (2016.01)
*H01L 27/32* (2006.01)

(52) U.S. Cl.
CPC ....... *G09G 3/3225* (2013.01); *H01L 27/3248* (2013.01); *H01L 27/3265* (2013.01); *H01L 27/3276* (2013.01)

(58) Field of Classification Search
CPC .............. G09G 3/3225; H01L 27/3248; H01L 27/3265; H01L 27/3276
See application file for complete search history.

(56) References Cited

U.S. PATENT DOCUMENTS 9,183,772 B2 * 11/2015 Tsuchi ................ G09G 3/3291
10,679,567 B2 * 6/2020 Lee ..................... H01L 51/0097
(Continued)

OTHER PUBLICATIONS

Extended European search report of counterpart European application No. 19945474.5 dated Oct. 26, 2022.

*Primary Examiner* — Duc Q Dinh
(74) *Attorney, Agent, or Firm* — Fay Sharpe LLP

(57) ABSTRACT

The present disclosure provides an array substrate and a display device. The array substrate includes: a base substrate, a plurality of sub-pixels, a plurality of data lines, a plurality of first power lines, a plurality of data line leads; and the array substrate further includes: a plurality of selector switches; a plurality of data signal input lines, at a side of the plurality of selector switches away from the display region, each of at least a part of the plurality of selector switches being connected to one data signal input line; a first power bus, at a side of the plurality of selector switches away from the display region; and a plurality of connecting portions, connected to the first power bus and the plurality of first power lines, the plurality of connecting portions extending towards the display region along regions between the plurality of selector switches.

18 Claims, 6 Drawing Sheets

(56) References Cited

U.S. PATENT DOCUMENTS

| | | | |
|---|---|---|---|
| 2004/0004591 A1 | 1/2004 | Akimoto et al. | |
| 2010/0259563 A1* | 10/2010 | Tokuda | G09G 3/2014 |
| | | | 345/690 |
| 2017/0003541 A1* | 1/2017 | Xu | G02F 1/13454 |
| 2019/0392767 A1* | 12/2019 | Kim | G09G 3/20 |
| 2020/0083306 A1* | 3/2020 | Choi | H01L 27/326 |
| 2020/0381653 A1* | 12/2020 | Bang | H01L 27/3276 |

* cited by examiner

ARRAY SUBSTRATE AND DISPLAY DEVICE

CROSS-REFERENCE TO RELATED APPLICATIONS

The present application is a 371 of PCT Patent Application Serial No. PCT/CN2019/111057, filed on Oct. 14, 2019.

TECHNICAL FIELD

The present disclosure relates to the field of display, and in particular to an array substrate and a display device.

BACKGROUND

In recent years, with the progress of the intelligent display technology, the Organic Light Emitting Diode (OLED) has become one of hotspots in the field of display research at present, and increasingly more Active Matrix Organic Light Emitting Diode (AMOLED) displays are emerging on the market. Compared with the conventional Thin Film Transistor Liquid Crystal Display (TFT-LCD), the AMOLED display has the advantages of a faster response speed and a higher contrast.

SUMMARY

The present disclosure provides an array substrate and a display device.

According to a first aspect, the present disclosure provides an array substrate, including:

a base substrate, the base substrate including a display region and a peripheral region located at at least one side of the display region;

a plurality of sub-pixels, located in the display region;

a plurality of data lines, located in the display region, and used to provide data signals for the plurality of sub-pixels;

a plurality of first power lines, located in the display region, and used to provide a power signal for the plurality of sub-pixels;

a plurality of data line leads, located in the peripheral region and electrically connected to the plurality of data lines;

a plurality of selector switches, located in the peripheral region and arranged at intervals, the plurality of selector switches being located at a side of the plurality of data lines away from the display region, and each of at least a part of the plurality of selector switches being connected to at least two data line leads in the plurality of data line leads;

a plurality of data signal input lines, located in the peripheral region and located at a side of the plurality of selector switches away from the display region, each of at least a part of the plurality of selector switches being connected to one of the plurality of data signal input lines;

a first power bus, located in the peripheral region and located at a side of the plurality of selector switches away from the display region; and a plurality of connecting portions, electrically connected to the first power bus and the plurality of first power lines, the plurality of connecting portions extending towards the display region along regions between the plurality of selector switches.

Optionally, the array substrate further includes a second power bus located between the plurality of selector switches and the display region; and the plurality of connecting portions are respectively connected to the first power bus and the second power bus.

Optionally, the first power bus and the second power bus are located in the same layer.

Optionally, the first power bus, the second power bus and the plurality of connecting portions are located in the same layer.

Optionally, the first power bus, the second power bus and the plurality of connecting portions define a plurality of first apertures which are arranged in an array, and orthographic projections of the plurality of selector switches on the base substrate fall within the plurality of first apertures.

Optionally, the array substrate further includes a third power bus, and an orthographic projection of the third power bus on the base substrate at least partially overlaps with an orthographic projection of the first power bus on the base substrate, and the third power bus is connected to the first power bus.

Optionally, the array substrate further includes a fourth power bus, and an orthographic projection of the fourth power bus on the base substrate at least partially overlaps with an orthographic projection of the second power bus on the base substrate, and the fourth power bus is connected to the second power bus.

Optionally, the third power bus and the fourth power bus are located in the same layer.

Optionally, at least one of the plurality of sub-pixels includes a drive TFT and a connecting electrode;

the drive TFT includes a drive active layer located on the base substrate, a drive gate located at a side of the drive active layer away from the base substrate, and a drive source and a drive drain which are located at a side of the drive gate away from the base substrate; and the connecting electrode is located at a side of the drive source and the drive drain away from the base substrate; and the first power bus, the second power bus and the connecting electrode are located in the same layer.

Optionally, at least one of the plurality of sub-pixels includes a drive TFT and a connecting electrode;

the drive TFT includes a drive active layer located on the base substrate, a drive gate located at a side of the drive active layer away from the base substrate, and a drive source and a drive drain which are located at a side of the drive gate away from the base substrate; and the connecting electrode is located at a side of the drive source and the drive drain away from the base substrate; and the third power bus, the fourth power bus and the drive source are located in the same layer, or the third power bus, the fourth power bus and the drive drain are located in the same layer.

Optionally, each selector switch includes:

a first active layer located on the base substrate;

a first gate and a second gate which are located at a side of the first active layer away from the base substrate, the first gate and the second gate being located in the same layer and failing to overlap; and a first source, a first drain and a second drain which are located at a side of the first gate and the second gate away from the base substrate, the first source, the first drain and the second drain being located in the same layer and failing to overlap, and the first source being located between the first drain and the second drain; and the first source is connected to one data signal input line of the plurality of data signal input lines, and the first drain and the second drain are connected to one data line lead in the plurality of data line leads.

Optionally, an orthographic projection of each of the first gate and the second gate on the base substrate fails to overlap with orthographic projections of the first source, the first drain and the second drain on the base substrate.

Optionally, the array substrate further includes a first control line and a second control line;

the first control line is connected to the first gate, and the second control line is connected to the second gate; and orthographic projections of the first control line and the second control line on the base substrate overlap with orthographic projections of the plurality of first apertures on the base substrate.

Optionally, at least one of the plurality of connecting portions includes a second aperture, and an orthographic projection of the second aperture on the base substrate overlaps with the orthographic projections of the first control line and the second control line on the base substrate.

Optionally, the plurality of data line leads are located in the same layer with the first gate or the second gate.

Optionally, the plurality of data signal input lines include a first data signal input line and a second data signal input line, the first data signal input line and the second data signal input line are arranged alternately, and the first data signal input line and the second data signal input line are located in different layers.

Optionally, at least one of the plurality of sub-pixels includes a drive TFT, a connecting electrode and a storage capacitor;

the drive TFT includes a drive active layer located on the base substrate, a drive gate located at a side of the drive active layer away from the base substrate, a gate insulating layer (GI2) located at a side of the drive gate away from the base substrate, an interlayer dielectric layer located at a side of the gate insulating layer (GI2) away from the base substrate, and a drive source and a drive drain which are located at a side of the interlayer dielectric layer away from the base substrate; and the connecting electrode is located at a side of the drive source and the drive drain away from the base substrate;

the storage capacitor includes a first capacitive electrode and a second capacitive electrode, the first capacitive electrode and the drive gate are located in the same layer, and the second capacitive electrode is located between the gate insulating layer (GI2) and the interlayer dielectric layer; and the first data signal input line and the drive gate are located in the same layer, and the second data signal input line and the second capacitive electrode are located in the same layer.

Optionally, the first active layer and the drive active layer are located in the same layer, the first gate and the drive gate are located in the same layer, and the first source and the drive source are located in the same layer.

Optionally, the at least one of the plurality of sub-pixels further includes: an LED located at a side of the connecting electrode away from the base substrate, and the drive drain, the connecting electrode and the LED are sequentially connected.

According to a second aspect, the present disclosure provides a display device, including the above any array substrate.

DETAILED DESCRIPTION

For clearer descriptions of the principles, technical solutions, and advantages in the present disclosure, the implementation manners of the present disclosure are further described in detail below with reference to the accompanying drawings.

The array substrate in the relevant art includes: a display region and a peripheral region. A power bus for providing a power signal (which is often denoted by VDD in the art) for the display region, and a selector switch, such as a Multiplexer (MUX), for providing a data signal for the display region, are arranged in the peripheral region. However, the power bus overlaps with the selector switch to result in the parasitic capacitance, thus affecting the normal work of the power bus and the selector switch.

Figure 1:
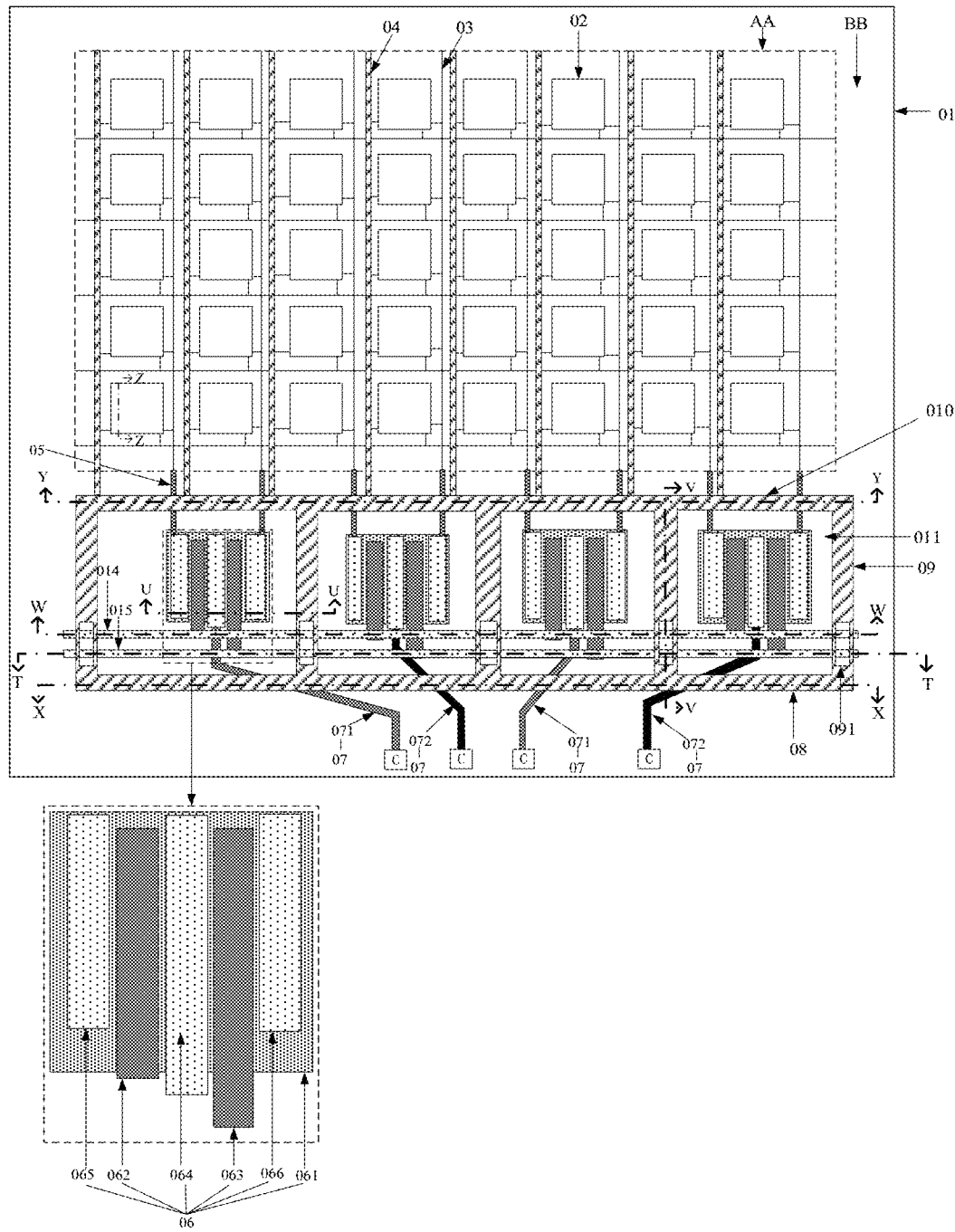
FIG. 1 is a schematic structural diagram of an array substrate provided by an embodiment of the present disclosure.

An embodiment of the present disclosure provides an array substrate. In the array substrate, the power bus does not overlap with the MUX, such that the parasitic capacitance is not generated. FIG. 1 is a schematic structural diagram of an array substrate provided by an embodiment of the present disclosure. As shown in FIG. 1, the array substrate includes:

a base substrate 01, the base substrate 01 including a display region AA and a peripheral region BB located at at least one side of the display region AA, and FIG. 1 taking that the peripheral region BB is located on four sides of the display region AA as the example;

a plurality of sub-pixels 02, located in the display region AA;

a plurality of data lines 03, located in the display region AA, and used to provide data signals for the plurality of sub-pixels 02;

a plurality of first power lines 04, located in the display region AA, and used to provide a power signal for the plurality of sub-pixels 02;

a plurality of data line leads 05, located in the peripheral region BB and connected to the plurality of data lines 03;

a plurality of selector switches 06, located in the peripheral region BB and arranged at intervals, the plurality of selector switches 06 being located at a side of the plurality of data lines 05 away from the display region AA, and each selector switch of at least a part of selector switches 06 in the plurality of selector switches 06 being connected to at least two data line leads 05 in the plurality of data line leads 05, and FIG. 1 taking that each selector switch 06 is connected to two data line leads 05 as the example;

a plurality of data signal input lines 07, located in the peripheral region BB and located at a side of the plurality of selector switches 06 away from the display region AA, and each selector switch 06 of at least a part of selector switches

06 in the plurality of selector switches 06 being connected to one of the plurality of data signal input lines 07, and FIG. 1 taking that each selector switch 06 is connected to one data signal input line 07 as the example;

a first power bus 08, located in the peripheral region BB and located at a side of the plurality of selector switches 06 away from the display region AA; and a plurality of connecting portions 09, connected to the first power bus 08 and the plurality of first power lines 04, the plurality of connecting portions 09 extending towards the display region AA along regions between the plurality of selector switches 06.

In summary, in the array substrate provided by the embodiment of the present disclosure, the first power bus located in the peripheral region does not overlap with the selector switch. Therefore, the overlapping degree between the first power bus and the selector switch is reduced, the parasitic capacitance formed by the first power bus and the selector switch is reduced, and the first power line and the selector switch can work normally.

It is to be noted that in the embodiment of the present disclosure, the first power bus 08 may be connected to the sub-pixel 02 in the display region AA through the plurality of connecting portions 09 and the plurality of first power lines 04 to supply the power to the sub-pixel 02.

Optionally, referring also to FIG. 1, the array substrate further includes a second power bus 010 located between the plurality of selector switches 06 and the display region AA. The plurality of connecting portions 09 are respectively connected to the first power bus 08 and the second power bus 010, i.e., each connecting portion 09 is connected to the first power bus 08 and the second power bus 010. As can be seen from FIG. 1, the second power bus 010 also does not overlap with the selector switch 06, so no parasitic capacitance exists between the second power bus 010 and the selector switch 06, and the second power bus 010 can also work normally.

Exemplarily, the first power bus 08 and the second power bus 010 are located in the same layer. It is to be noted that the location of two structures in the same layer means that the two structures are made of the same material, and the two structures may be obtained simultaneously by using the patterning process at a time. When the first power bus 08 and the second power bus 010 are located in the same layer, the first power bus 08 and the second power bus 010 may be obtained simultaneously by using the patterning process at a time, and thus the complexity of the process for manufacturing the array substrate can be reduced. Further, the first power bus 08, the second power bus 010 and the plurality of connecting portions 09 are located in the same layer. At this time, the first power bus 08, the second power bus 010 and the plurality of connecting portions 09 can be manufactured by using the patterning process at the same time, and thus the complexity of the process for manufacturing the array substrate can further be reduced. Certainly, the first power bus and the second power bus may also not be located in the same layer, which is not limited by the embodiment of the present disclosure thereto.

Referring also to FIG. 1, the first power bus 08, the second power bus 010 and the plurality of connecting portions 09 define a plurality of first apertures 011 that are arranged in an array, and orthographic projections of the plurality of selector switches 06 on the base substrate 01 fall within the plurality of first apertures 011. Exemplarily, the plurality of selector switches 06 are in one-to-one correspondence with the plurality of first apertures 011, and the orthographic projection of each selector switch 06 on the base substrate 01 may be located in the corresponding first aperture 011. It can be seen that the first power bus 08, the second power bus 010 and the connecting portion 09 that are used to transmit the power signal do not overlap with the selector switch 06, thus reducing the parasitic capacitance, and effectively transmitting the power signal to the sub-pixel 02 in the display region AA.

Figure 2:
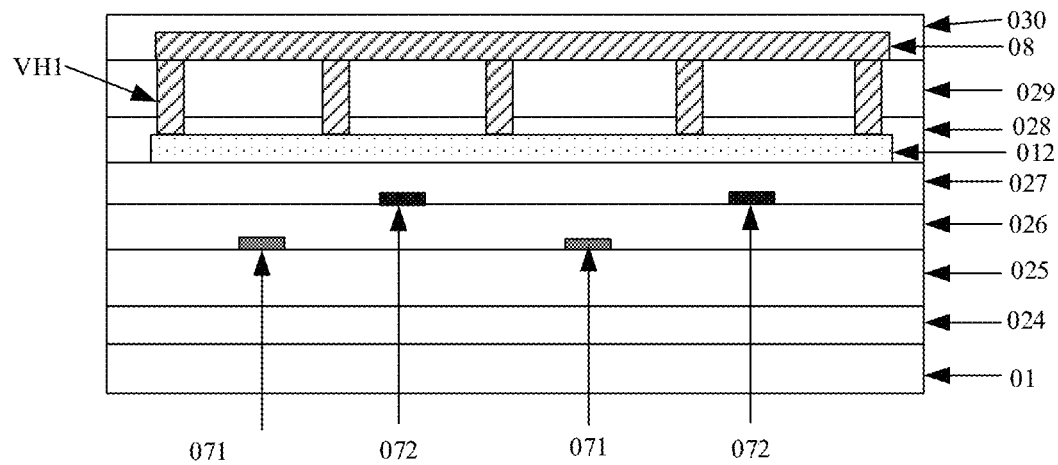
FIG. 2 is a schematic diagram of a section XX in FIG. 1 provided by an embodiment of the present disclosure.

Optionally, FIG. 2 is a schematic diagram of a section XX in FIG. 1 provided by an embodiment of the present disclosure. Referring to FIG. 1 and FIG. 2, the array substrate further includes a third power bus 012; an orthographic projection of the third power bus 012 on the base substrate 01 at least partially overlaps with an orthographic projection of the first power bus 08 on the base substrate 01; and the third power bus 012 is connected to the first power bus 08. Exemplarily, some insulating layers are provided between the first power bus 08 and the third power bus 012, and the first power bus 08 may be connected to the third power bus 012 through via holes VH1 in the insulating layers.

It is to be noted that the power bus used to transmit the power signal in the relevant art is typically of a single-layer structure. The high resistance and the large pressure drop are as a result of the single-layer structure when the power signal is transmitted. In the embodiment of the present disclosure, the first power bus 08 may further be connected to the third power bus 012, such that the structure used to transmit the power signal is of a double-layer structure, thereby reducing the resistance and the pressure drop when the power signal is transmitted.

Figure 3:
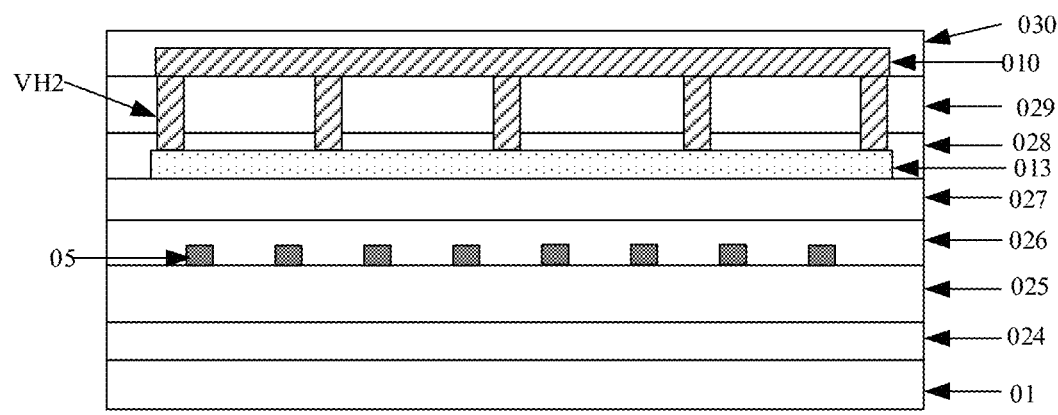
FIG. 3 is a schematic diagram of a section YY in FIG. 1 provided by an embodiment of the present disclosure.

Optionally, FIG. 3 is a schematic diagram of a section YY in FIG. 1 provided by an embodiment of the present disclosure. Referring to FIG. 1 and FIG. 3, the array substrate further includes a fourth power bus 013; an orthographic projection of the fourth power bus 013 on the base substrate 01 at least partially overlaps with an orthographic projection of the second power bus 010 on the base substrate 01; and the fourth power bus 013 is connected to the second power bus 010. Exemplarily, some insulating layers are provided between the second power bus 010 and the fourth power bus 013, and the second power bus 010 may be connected to the fourth power bus 013 through via holes VH2 in the insulating layers.

When the array substrate further includes the fourth power bus 013, the second power bus 010 may further be connected to the fourth power bus 013, such that the structure used to transmit the power signal is of a double-layer structure, thereby reducing the resistance and the pressure drop when the power signal is transmitted.

Exemplarily, the third power bus 012 in FIG. 2 and the fourth power bus 013 in FIG. 3 may be located in the same layer. With such a manner, when the array substrate is manufactured, the third power bus 012 and the fourth power bus 013 may be manufactured simultaneously, thus reducing the complexity of the process for manufacturing the array substrate. Certainly, the third power bus 012 and the fourth power bus 013 may also not be located in the same layer, which is not limited by the embodiment of the present disclosure thereto. Optionally, the connecting portion 09 of the single-layer structure is used as the example in the embodiment of the present disclosure. Certainly, the connecting portion 09 may also be made into the double-layer structure. For example, the connecting portion 09 further includes a connecting sub-portion 09' (not shown and labeled in the drawings of the specification), and the connecting sub-portion 09' is located in the same layer with the third power bus 012, and connected to the third power bus 012 and the fourth power bus 013. Optionally, the connecting portion 09 may further be connected to the connecting sub-portion 09' through a via hole.

Figure 4:
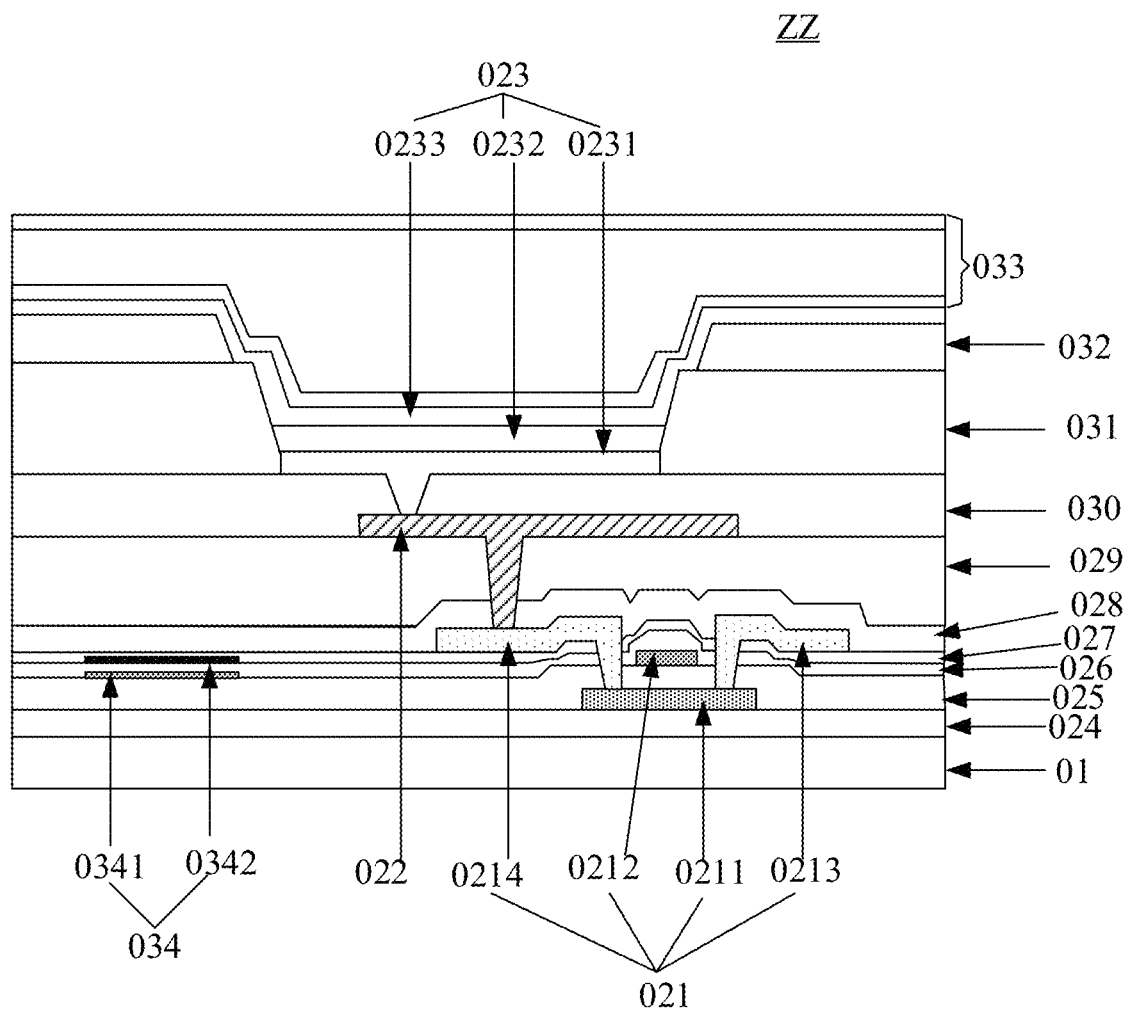
FIG. 4 is a schematic diagram of a section ZZ in FIG. 1 provided by an embodiment of the present disclosure.

FIG. 4 is a schematic diagram of a section ZZ in FIG. 1 provided by an embodiment of the present disclosure. Referring to FIG. 4, at least one sub-pixel 02 of the plurality of sub-pixels 02 in the display region AA includes a drive TFT 021 and a connecting electrode 022. The drive TFT 021 includes a drive active layer 0211 located on the base substrate 01, a drive gate 0212 located at a side of the drive active layer 0211 away from the base substrate 01, and a drive source 0213 and a drive drain 0214 that are located at a side of the drive gate 0212 away from the base substrate 01. The connecting electrode 022 is located at a side of the drive source 0213 and the drive drain 0214 away from the base substrate 01. The sub-pixel in FIG. 4 may further include an LED 023 (including a first electrode 0231, a luminous layer 0232 and a second electrode 0233 that are sequentially arranged along a direction away from the base substrate 01), the LED 023 is located at a side of the connecting electrode 022 away from the base substrate 01, and the drive drain 0214, the connecting electrode 022 and the LED 023 are sequentially connected.

Further, the sub-pixel 02 in FIG. 4 may further include: a buffer layer 024, a first gate insulating layer 025, a second gate insulating layer 026, an interlayer dielectric layer 027, a passivation layer 028, a first planarization layer 029, a second planarization layer 030, a pixel defining layer 031, a support layer 032 and a packaging layer 033 that are sequentially arranged along the direction away from the base substrate 01. The drive active layer 0211 is located between the buffer layer 024 and the first gate insulating layer 025; the drive gate 0212 is located between the first gate insulating layer 025 and the second gate insulating layer 026; the drive source 0213 and the drive drain 0214 are located between the interlayer dielectric layer 027 and the passivation layer 028; and the connecting electrode 022 is located between the first planarization layer 029 and the second planarization layer 030. The pixel defining layer 031 is used to define a pixel region on the base substrate 01, and the LED 023 is located in the pixel region.

It is to be noted that the buffer layer 024, the first gate insulating layer 025, the second gate insulating layer 026, the interlayer dielectric layer 027, the passivation layer 028, the first planarization layer 029 and the second planarization layer 030 in the display region AA may extend to the peripheral region BB. The relative positional relationship among the film layers in the peripheral region BB is the same as that in the display region AA, which is not elaborated herein in the embodiment of the present disclosure.

In addition, the sub-pixel 02 in FIG. 4 may further include: a storage capacitor 034. The storage capacitor 034 includes a first capacitive electrode 0341 and a second capacitive electrode 0342. The first capacitive electrode 0341 and the drive gate 0212 are located in the same layer, and the second capacitive electrode 0342 is located between the gate insulating layer 026 and the interlayer dielectric layer 027.

Optionally, a part of structures of the display region AA and a part of structures of the peripheral region BB in the array substrate may be located in the same layer, and the structures are described hereinafter.

Exemplarily, the first power bus 08 and the second power bus 010 may be located in the same layer with the connecting electrode 022. With such a manner, when the connecting electrode 022 in the display region AA is manufactured, the first power bus 08 and the second power bus 010 in the peripheral region BB may be manufactured simultaneously, thus simplifying the process for manufacturing the array substrate. Certainly, the first power bus 08 and the second power bus 010 may also not be located in the same layer with the connecting electrode 022, which is not limited by the embodiment of the present disclosure thereto.

When the connecting portion 09 and the first power bus 08 are located in the same layer, if the first power bus 08 is still located in the same layer with the connecting electrode 022, it is indicated that the connecting portion 09 and the connecting electrode 022 are also located in the same layer. The selector switch 06 is often located on a different layer with the connecting electrode 022. Thus, the connecting portion 09, the first power bus 08 and the second power bus 010 are all located in different layers with the selector switch 06, thereby further reducing the parasitic capacitance between the connecting portion 09 and the first power bus 08 as well as between the second power bus 010 and the selector switch 06.

Also, exemplarily, the third power bus 012, the fourth power bus 013 and the drive source 0213 are located in the same layer, or, the third power bus 012, the fourth power bus 013 and the drive drain 0214 are located in the same layer. The embodiment of the present disclosure takes that the drive source 0213 and the drive drain 0214 are located in the same layer as the example, so the third power bus 012, the fourth power bus 013, the drive source 0213 and the drive drain 0214 are located in the same layer. Certainly, the third power bus 012, the fourth power bus 013 and the drive source 0213 may also not be located in the same layer, and the third power bus 012, the fourth power bus 013 and the drive drain 0214 may also not be located in the same layer, which is not limited by the embodiment of the present disclosure thereto.

Figure 5:
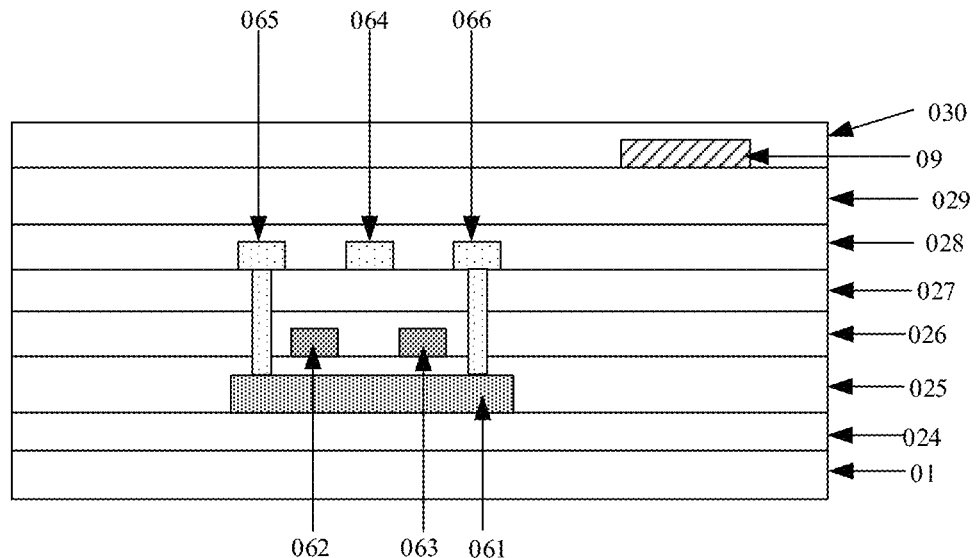
FIG. 5 is a schematic diagram of a section UU in FIG. 1 provided by an embodiment of the present disclosure.

FIG. 5 is a schematic diagram of a section UU in FIG. 1 provided by an embodiment of the present disclosure. Referring to FIG. 1 and FIG. 5, the selector switch 06 may include:

a first active layer 061 located on the base substrate 01;

a first gate 062 and a second gate 063 that are located at a side of the first active layer 061 away from the base substrate 01, the first gate 062 and the second gate 063 being located in the same layer and failing to overlap; and a first source 064, a first drain 065 and a second drain 066 that are located at a side of the first gate 062 and the second gate 063 away from the base substrate 01, the first source 064, the first drain 065 and the second drain 066 being located in the same layer and failing to overlap, and the first source 064 being located between the first drain 065 and the second drain 066.

The first source 064 is connected to one data signal input line 07 of the plurality of data signal input lines 07, and the first drain 065 and the second drain 066 are connected to two data line lead 05 in the plurality of data line leads 05.

Optionally, an orthographic projection of each of the first gate 062 and the second gate 063 on the base substrate 01 does not overlap with orthographic projections of the first source 064, the first drain 065 and the second drain 066 on the base substrate 01.

Optionally, some structures in the selector switch 06 may be located in the same layer with some structures in the drive transistor. For example, the first active layer 061 and the drive active layer 0211 are located in the same layer, the first gate 062 and the drive gate 0212 are located in the same layer, and the first source 064 and the drive source 0213 are located in the same layer. Certainly, the first active layer 061 and the drive active layer 0211 may also not be located in the same layer, the first gate 062 and the drive gate 0212 may also not be located in the same layer, and the first source 064 and the drive source 0213 may also not be located in the same layer, which is not limited by the embodiment of the present disclosure thereto.

Referring also to FIG. 1, the array substrate may further include a first control line 014 and a second control line 015; the first control line 014 is connected to the first gate 062, and the second control line 015 is connected to the second gate 063; and orthographic projections of the first control line 014 and the second control line 015 on the base substrate 01 overlap with the orthographic projections of the plurality of first apertures 011 on the base substrate 01.

Figure 6:
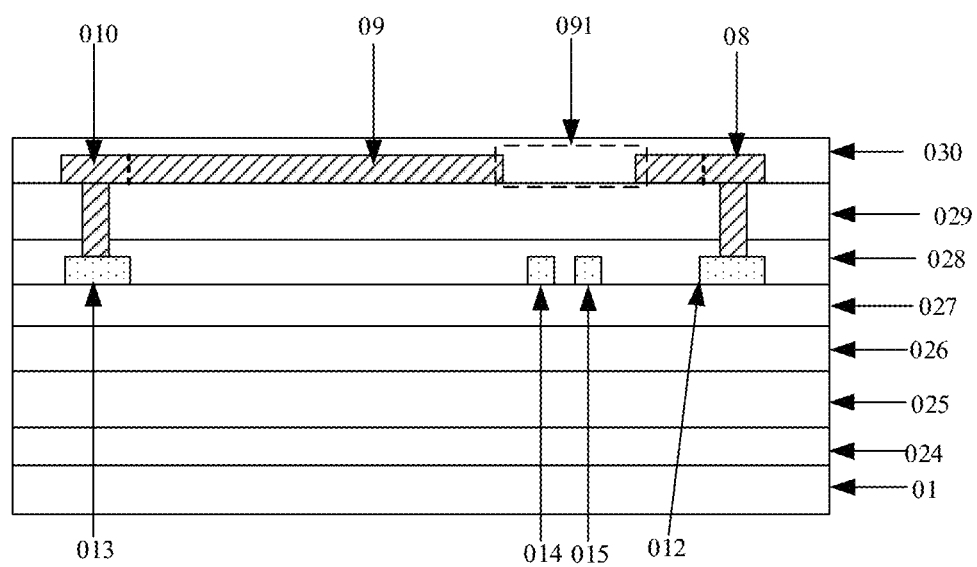
FIG. 6 is a schematic diagram of a section VV in FIG. 1 provided by an embodiment of the present disclosure.
Figure 7:
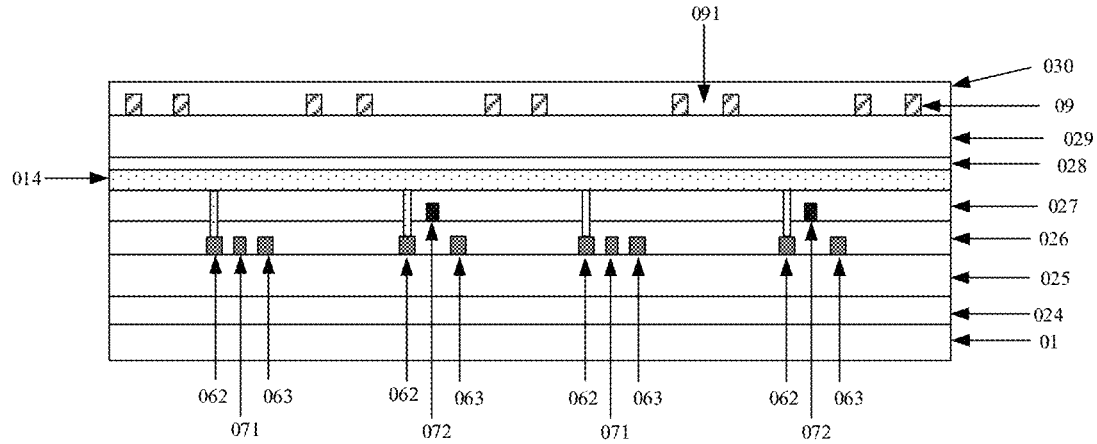
FIG. 7 is a schematic diagram of a section WW in FIG. 1 provided by an embodiment of the present disclosure.
Figure 8:
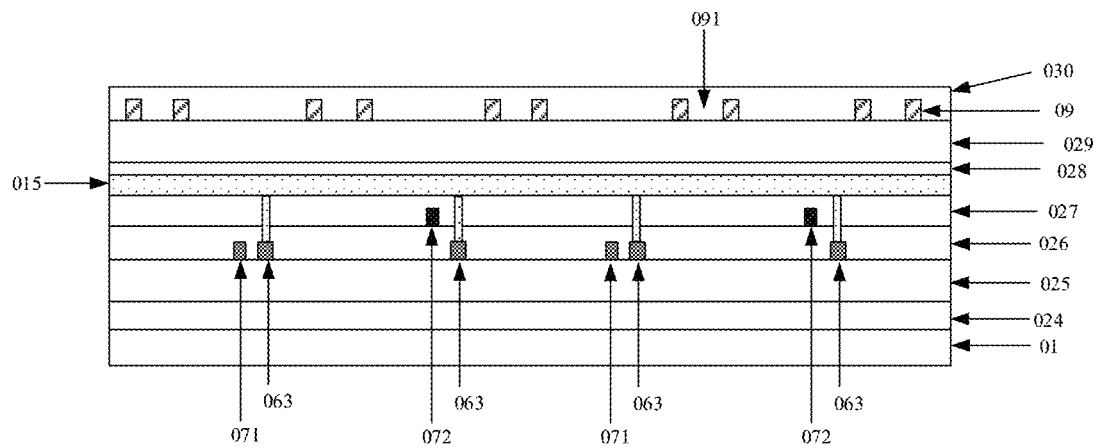
FIG. 8 is a schematic diagram of a section TT in FIG. 1 provided by an embodiment of the present disclosure.

Optionally, FIG. 6 is a schematic diagram of a section VV in FIG. 1 provided by an embodiment of the present disclosure. FIG. 7 is a schematic diagram of a section WW in FIG. 1 provided by an embodiment of the present disclosure. FIG. 8 is a schematic diagram of a section TT in FIG. 1 provided by an embodiment of the present disclosure. Referring to FIG. 1, FIG. 6, FIG. 7 and FIG. 8, at least one connecting portion 09 of the plurality of connecting portions 09 includes a second aperture 091, and an orthographic projection of the second aperture 091 on the base substrate 01 overlaps with the orthographic projections of the first control line 014 and the second control line 015 on the base substrate 01. It is to be noted that the second aperture 091 is provided in the connecting portion 09 in the embodiment of the present disclosure. Under the action of the second aperture 091, the overlapping degree between the connecting portion 09 and the first control line 014 and the second control line 015 can be reduced. Thus, the parasitic capacitance formed by the connecting portion 09 and the two control lines can be reduced, thereby further alleviating the influence on the power signal transmitted on the connecting portion 09.

Optionally, the plurality of data line leads 05 are located in the same layer with the first gate 062 or the second gate 063. Exemplarily, the first gate 062 and the second gate 063 may be located in the same layer. At this time, the plurality of data line leads 05, the first gate 062 and the second gate 063 are all located in the same layer. Certainly, the plurality of data line leads 05 may also not be located in the same layer with the first gate 062 or the second gate 063, which is not limited by the embodiment of the present disclosure thereto.

Optionally, the plurality of data signal input lines 07 include a first data signal input line 071 and a second data signal input line 072, the first data signal input line 071 and the second data signal input line 072 are arranged alternately, and the first data signal input line 071 and the second data signal input line 072 are located in different layers. Exemplarily, the first data signal input line 071 and the drive gate (such as the drive gate 0212 in FIG. 4) in the sub-pixel 02 are located in the same layer, and the second data signal input line 072 and the second capacitive electrode 0342 in the sub-pixel 02 are located in the same layer. Certainly, the first data signal input line 071 and the drive gate in the sub-pixel 02 may also not be located in the same layer, and the second data signal input line 072 and the second capacitive electrode 0342 in the sub-pixel 02 may also not be located in the same layer, which is not limited by the embodiment of the present disclosure thereto.

The working principles of the array substrate provided by the embodiment of the present disclosure are described hereinafter.

When the array substrate needs to display the image, the power signal is transmitted on the first power bus, the second power bus, the third power bus, the fourth power bus and the connecting portion in the array substrate. The power signal is transmitted to each sub-pixel through a plurality of first power lines.

When the array substrate needs to display the image, the signal source end in the array substrate (such as a plurality of signal input pads C in FIG. 1) may also respectively input the data signal to a plurality of selector switches through a plurality of data signal input lines. When the signal source end inputs the data signal to one selector switch via each data signal input line, the data signal is input to the first source of the selector switch. In cooperation with the first control line and the second control line, the data signal on the first source may be respectively transmitted to two data lines. Exemplarily, an on signal may be first input to the first control line, such that the first source is connected to the first drain. At this time, the data signal on the first source is transmitted to one data line through the first drain and one data line lead. Thereafter, an on signal is input to the second control line, such that the first source is connected to the second drain. In this case, the data signal on the first source is transmitted to the other data line through the second drain and the other data line lead. After the data signal is input to each data line, the sub-pixel connected to each data line also receives the data signal.

Upon the reception of the power signal and the data signal, each sub-pixel may emit light based on the power signal and the data signal, thereby implementing the purpose that the array substrate displays the image. As the overlapping degree between the structure used to transmit the power signal and the selector switch is low in the array substrate provided by the embodiment of the present disclosure, both the structure used to transmit the power signal and the selector switch can work normally. Furthermore, the structure used to transmit the power signal in the array substrate is of a multi-layer structure, so the impedance for transmitting the power signal is small and the power signal can be effectively transmitted to the sub-pixel. Besides, as the array substrate provided by the embodiment of the present disclosure includes a plurality of structures located in the same layer, the process for manufacturing the array substrate is simple.

Optionally, in the array substrate provided by the embodiment of the present disclosure, the conductive structure may be made of a transparent material, and may also be made of a nontransparent material, such as a metal simple substance or alloy of indium tin oxide, copper, aluminum, silver, molybdenum, nickel, gold and other metal elements.

The present disclosure further provides a method for manufacturing the above any array substrate. The method includes the following steps.

A plurality of sub-pixels, a plurality of data lines, a plurality of first power lines, a plurality of data line leads, a plurality of selector switches, a plurality of data signal input lines, a first power bus and a plurality of connecting portions are formed on a base substrate.

The base substrate includes a display region and a peripheral region located at at least one side of the display region.

The plurality of sub-pixels are located in the display region.

The plurality of data lines are located in the display region, and used to provide data signals for the plurality of sub-pixels.

The plurality of first power lines are located in the display region, and used to provide a power signal for the plurality of sub-pixels.

The plurality of data line leads are located in the peripheral region and connected to the plurality of data lines.

The plurality of selector switches are located in the peripheral region and arranged at intervals, the plurality of selector switches are located at a side of the plurality of data lines away from the display region, and each of at least a part of the plurality of selector switches is connected to at least two data line leads in the plurality of data line leads.

The plurality of data signal input lines are located in the peripheral region and located at a side of the plurality of selector switches away from the display region, and each of at least a part of the plurality of selector switches is connected to one of the plurality of data signal input lines.

The first power bus is located in a peripheral region and located at a side of the plurality of selector switches away from the display region.

The plurality of connecting portions are connected to the first power bus and the plurality of first power lines, and the plurality of connecting portions extend towards the display region along regions between the plurality of selector switches.

Optionally, one or more of a second power bus, a third power bus, a fourth power bus, a first control line and a second control line may further be manufactured on the base substrate. The structures may be referred to the above embodiment of the array substrate, and are not elaborated herein in the embodiment of the present disclosure.

It should be understood that the method in the embodiment of the present disclosure may be implemented, for example, by the way of changing the pattern on the mask, with reference to any method similar to the method for manufacturing the array substrate provided by the embodiment of the present disclosure, which is not elaborated one by one.

An embodiment of the present disclosure further provides a display device, including the above any array substrate. The display device in the embodiment of the present disclosure may be: any products or parts with display functions, such as a display panel (like the liquid crystal display panel, the OLED display panel and the like), a mobile phone, a tablet computer, a television, a display, a notebook computer, a digital photo frame, a navigator, etc.

Figure 9:
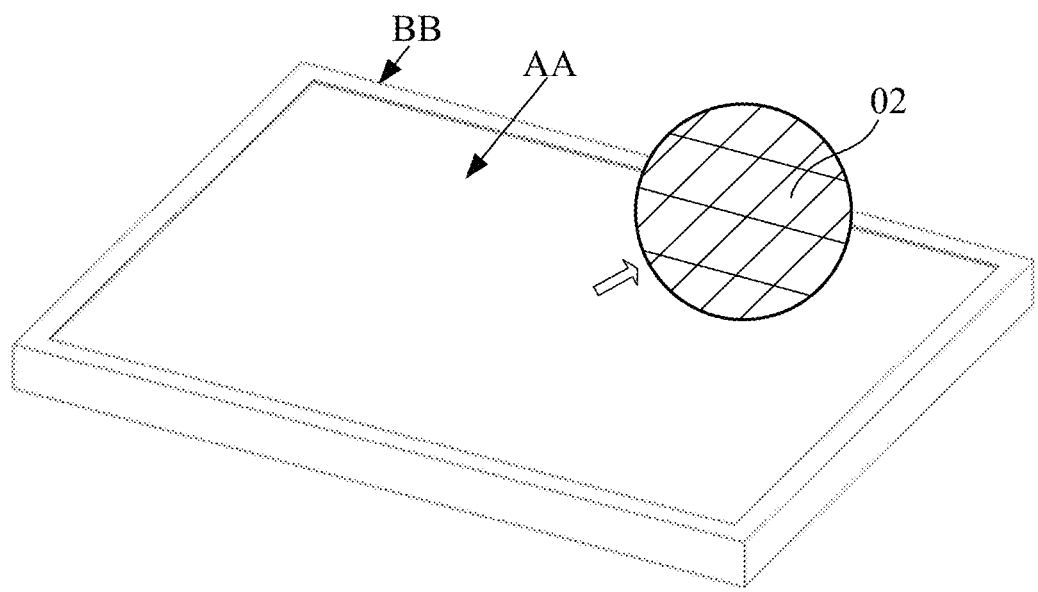
FIG. 9 is a schematic structural diagram of a display device provided by an embodiment of the present disclosure.

As an example, FIG. 9 is a schematic structural diagram of a display device provided by an embodiment of the present disclosure. The display device includes the above any display panel, and a display region AA of the display device includes sub-pixels 02 arranged in rows and columns. The detailed structure of the peripheral region BB is not shown in FIG. 9.

In the present disclosure, the term "at least one" refers to one or more, and the term "a plurality of" refers to two or more. The term "at least one of the followings" or similar expression refers to any combination of these items, including any combination of single items or plural items. For example, at least one of a, b or c may be expressed as: a, b, c, a+b, a+c, b+c and a+b+c; and the a, b and c may be the single items, and may also be the plural items.

It is to be noted that the sizes of a part or all of the layers may be exaggerated for the clarity in the accompanying drawings. It may be understood that when an element or a layer is referred to as being "on" another element or layer, it may be directly on the other element or an intervening layer may be present therebetween. Besides, it may be understood that when an element or a layer is referred to as being "under" another element or layer, it may be directly on the other element, or more than one intervening layer or element may be present therebetween. Additionally, it may further be understood that when an element or a layer is referred to as being "between" two layers or two elements, it may be a unique layer between the two layers or two elements, or more than one intervening layer or element may be present therebetween. The similar reference sign refers to the similar element throughout the specification.

In the present disclosure, the terms "first", "second" and the like are merely for the descriptive purpose but cannot be understood as indicating or implying a relative importance. The term "connection" between two conductors refers to direct or indirect connection between the two conductors, and the two conductors can transmit the electrical signal.

It is to be noted that the method embodiments according to the embodiments of the present disclosure can be cross-referenced with the embodiments of the corresponding transistor, which is not limited in the embodiments of the present disclosure thereto. The sequence of the steps of the method embodiment provided by the embodiments of the present disclosure may be properly adjusted, the steps may also be increased or reduced correspondingly as the case may be, and any method readily conceivable for those skilled in the art within the technical scope disclosed by the present disclosure should be included in the protection scope of the present disclosure and is not elaborated.

The descriptions above are only exemplary embodiments of the present disclosure rather than limits for the present disclosure; and any modifications, equivalent substitutions, improvements and the like made within the spirits and principles of the present disclosure should be included in the protection scope of the present disclosure.

What is claimed is:

1. An array substrate, comprising:
a base substrate, the base substrate comprising a display region and a peripheral region at at least one side of the display region;
a plurality of sub-pixels, in the display region;
a plurality of data lines, in the display region, and used to provide data signals for the plurality of sub-pixels;
a plurality of first power lines, in the display region, and used to provide a power signal for the plurality of sub-pixels;
a plurality of data line leads, in the peripheral region and electrically connected to the plurality of data lines;
a plurality of selector switches, in the peripheral region and arranged at intervals, the plurality of selector switches being at a side of the plurality of data lines away from the display region, and each of at least a part of the plurality of selector switches being electrically connected to at least two data line leads in the plurality of data line leads;
a plurality of data signal input lines, in the peripheral region and at a side of the plurality of selector switches away from the display region, each of at least a part of the plurality of selector switches being electrically connected to one of the plurality of data signal input lines;
a first power bus, in the peripheral region and at a side of the plurality of selector switches away from the display region;
a plurality of connecting portions, electrically connected to the first power bus, and electrically connected to the plurality of first power lines, the plurality of connecting portions extending towards the display region along regions between the plurality of selector switches; and
a second power bus between the plurality of selector switches and the display region, wherein the plurality of connecting portions are respectively and electrically connected to the first power bus and the second power bus;

wherein the first power bus, the second power bus and the plurality of connecting portions define a plurality of first apertures which are arranged in an array, and orthographic projections of the plurality of selector switches on the base substrate fall within the plurality of first apertures.

2. The array substrate according to claim 1, wherein the first power bus and the second power bus are in the same layer.

3. The array substrate according to claim 1, wherein the first power bus, the second power bus and the plurality of connecting portions are in the same layer.

4. The array substrate according to claim 1, further comprising a third power bus, wherein
an orthographic projection of the third power bus on the base substrate at least partially overlaps with an orthographic projection of the first power bus on the base substrate, and the third power bus is electrically connected to the first power bus.

5. The array substrate according to claim 4, further comprising a fourth power bus, wherein
an orthographic projection of the fourth power bus on the base substrate at least partially overlaps with an orthographic projection of the second power bus on the base substrate, and the fourth power bus is electrically connected to the second power bus.

6. The array substrate according to claim 5, wherein the third power bus and the fourth power bus are in the same layer.

7. The array substrate according to claim 1, wherein at least one of the plurality of sub-pixels comprises a drive TFT and a connecting electrode;
the drive TFT comprises a drive active layer on the base substrate, a drive gate at a side of the drive active layer away from the base substrate, and a drive source and a drive drain which are at a side of the drive gate away from the base substrate;
the connecting electrode is at a side of the drive source and the drive drain away from the base substrate; and
the first power bus, the second power bus and the connecting electrode are in the same layer.

8. The array substrate according to claim 5, wherein at least one of the plurality of sub-pixels comprises a drive TFT and a connecting electrode;
the drive TFT comprises a drive active layer on the base substrate, a drive gate at a side of the drive active layer away from the base substrate, and a drive source and a drive drain which are at a side of the drive gate away from the base substrate; and the connecting electrode is at a side of the drive source and the drive drain away from the base substrate; and
the third power bus, the fourth power bus and one of the drive source and the drive drain are in the same layer.

9. The array substrate according to claim 1, wherein each selector switch comprises:
a first active layer on the base substrate;
a first gate and a second gate which are at a side of the first active layer away from the base substrate, the first gate and the second gate being in the same layer and failing to overlap; and
a first source, a first drain and a second drain which are at a side of the first gate and the second gate away from the base substrate, the first source, the first drain and the second drain being in the same layer and failing to overlap, and the first source being between the first drain and the second drain; and the first source is electrically connected to one data signal input line of the plurality of data signal input lines, and the first drain and the second drain are electrically connected to one data line lead in the plurality of data line leads.

10. The array substrate according to claim 9, wherein an orthographic projection of each of the first gate and the second gate on the base substrate fails to overlap with orthographic projections of the first source, the first drain and the second drain on the base substrate.

11. The array substrate according to claim 10, further comprising a first control line and a second control line, wherein
the first control line is electrically connected to the first gate, and the second control line is electrically connected to the second gate; and
orthographic projections of the first control line and the second control line on the base substrate overlap with orthographic projections of the plurality of first apertures on the base substrate.

12. The array substrate according to claim 11, wherein at least one of the plurality of connecting portions comprises a second aperture, and an orthographic projection of the second aperture on the base substrate overlaps with the orthographic projections of the first control line and the second control line on the base substrate.

13. The array substrate according to claim 9, wherein the plurality of data line leads are in the same layer with one of the first gate and the second gate.

14. The array substrate according to claim 9, wherein the plurality of data signal input lines comprises a first data signal input line and a second data signal input line, the first data signal input line and the second data signal input line are arranged alternately, and the first data signal input line and the second data signal input line are in different layers.

15. The array substrate according to claim 14, wherein at least one of the plurality of sub-pixels comprises a drive TFT, a connecting electrode and a storage capacitor;
the drive TFT comprises a drive active layer on the base substrate, a drive gate at a side of the drive active layer away from the base substrate, a gate insulating layer at a side of the drive gate away from the base substrate, an interlayer dielectric layer at a side of the gate insulating layer away from the base substrate, and a drive source and a drive drain which are at a side of the interlayer dielectric layer away from the base substrate; and the connecting electrode is at a side of the drive source and the drive drain away from the base substrate;
the storage capacitor comprises a first capacitive electrode and a second capacitive electrode, the first capacitive electrode and the drive gate are in the same layer, and the second capacitive electrode is between the gate insulating layer and the interlayer dielectric layer; and
the first data signal input line and the drive gate are in the same layer, and the second data signal input line and the second capacitive electrode are in the same layer.

16. The array substrate according to claim 15, wherein the first active layer and the drive active layer are in the same layer, the first gate and the drive gate are in the same layer, and the first source and the drive source are in the same layer.

17. The array substrate according to claim 15, wherein the at least one of the plurality of sub-pixels further comprises: a LED at a side of the connecting electrode away from the base substrate, and the drive drain, the connecting electrode and the LED are sequentially connected.

18. A display device, comprising an array substrate, wherein the array substrate comprises:
- a base substrate, the base substrate comprising a display region and a peripheral region at at least one side of the display region;
- a plurality of sub-pixels, in the display region;
- a plurality of data lines, in the display region, and used to provide data signals for the plurality of sub-pixels;
- a plurality of first power lines, in the display region, and used to provide a power signal for the plurality of sub-pixels;
- a plurality of data line leads, in the peripheral region and electrically connected to the plurality of data lines;
- a plurality of selector switches, in the peripheral region and arranged at intervals, the plurality of selector switches being at a side of the plurality of data lines away from the display region, and each of at least a part of the plurality of selector switches being electrically connected to at least two data line leads in the plurality of data line leads;
- a plurality of data signal input lines, in the peripheral region and at a side of the plurality of selector switches away from the display region, each of at least a part of the plurality of selector switches being electrically connected to one of the plurality of data signal input lines;
- a first power bus, in the peripheral region and at a side of the plurality of selector switches away from the display region;
- a plurality of connecting portions, electrically connected to the first power bus, and electrically connected to the plurality of first power lines, the plurality of connecting portions extending towards the display region along regions between the plurality of selector switches; and
- a second power bus between the plurality of selector switches and the display region, wherein the plurality of connecting portions are respectively and electrically connected to the first power bus and the second power bus;
- wherein the first power bus, the second power bus and the plurality of connecting portions define a plurality of first apertures which are arranged in an array, and orthographic projections of the plurality of selector switches on the base substrate fall within the plurality of first apertures.

* * * * *